United States Patent [19]

Griscom

[11] 4,371,838

[45] Feb. 1, 1983

[54] OPTICAL FIBER WAVEGUIDE FOR MEASURING MAGNETIC FIELDS

[75] Inventor: David L. Griscom, Alexandria, Va.

[73] Assignee: The United States of America as represented by the Secretary of the Navy, Washington, D.C.

[21] Appl. No.: 190,298

[22] Filed: Sep. 24, 1980

[51] Int. Cl.$^3$ ............................................. G01R 33/00
[52] U.S. Cl. ................................. 324/244; 324/260; 343/703; 350/96.34
[58] Field of Search .............................. 324/244, 260; 350/96.30, 96.34; 372/6

[56] References Cited

U.S. PATENT DOCUMENTS 4,040,890  8/1977  Burrus, Jr. et al. .......... 350/96.30 X

OTHER PUBLICATIONS

Yariv et al. *Proposal for Defection of Magnetic Fields Through Magnetostrictive Perturbation of Optical Fibers,* Optics Letters, Mar. 1980, pp. 87-89.

*Primary Examiner*—Paul L. Gensler
*Attorney, Agent, or Firm*—Robert F. Beers; William T. Ellis; Kenneth E. Walden

[57] ABSTRACT

An optical fiber waveguide for detecting magnetic fields. The optical fiber waveguide includes therein an array of discrete elongate magnetized particles, all polarized in the same direction with their axes generally parallel with the longitudinal axis of the waveguide, which in the presence of a time-varying magnetic field are subjected to magnetostrictive effects and undergo linear dimension changes to cause a related longitudinal dimension change of the optical fiber waveguide whereby a laser beam passing longitudinally through the waveguide is subject to phase shifts detectable by interferometry.

17 Claims, 4 Drawing Figures

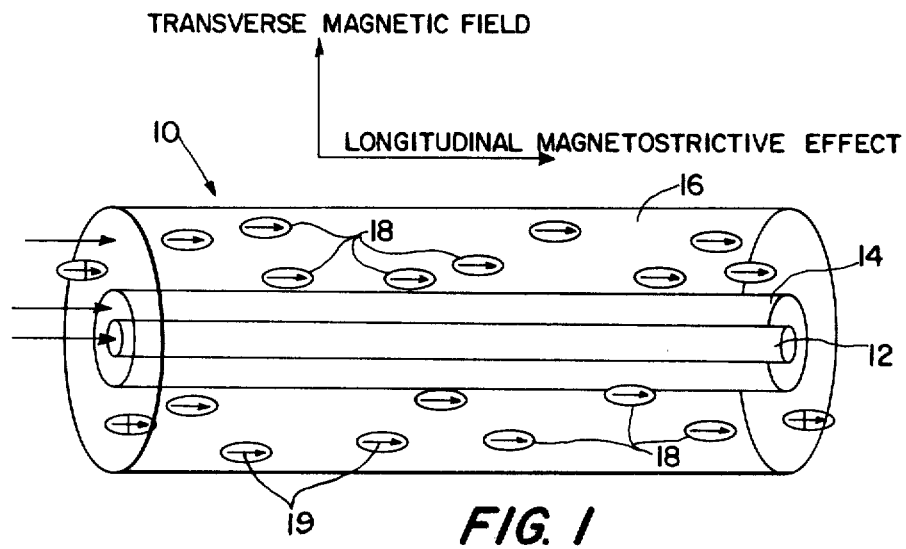
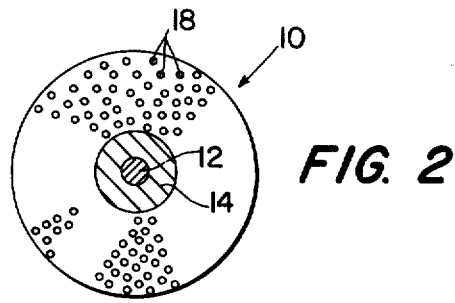
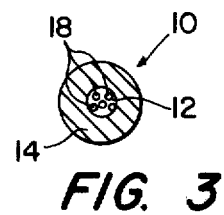
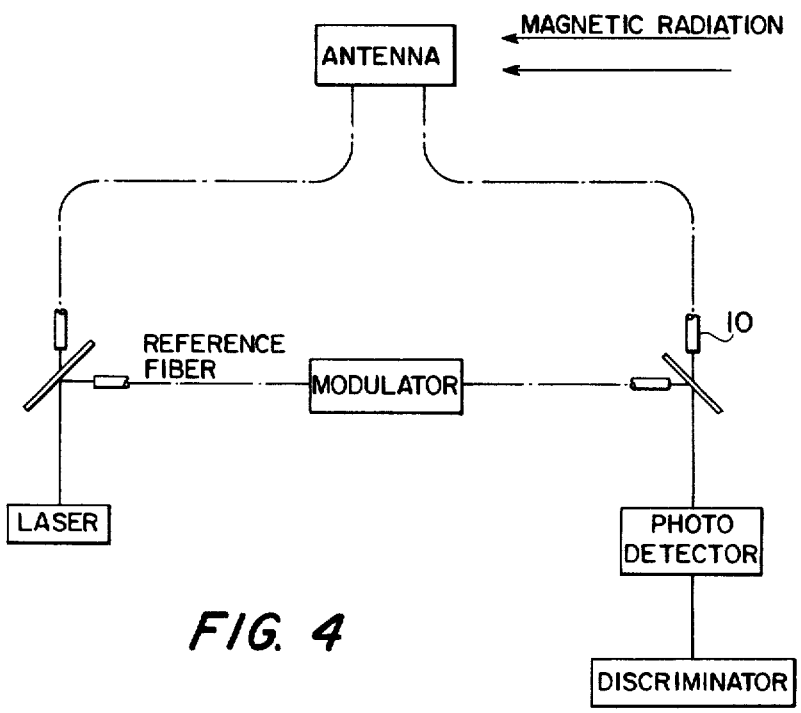

OPTICAL FIBER WAVEGUIDE FOR MEASURING MAGNETIC FIELDS

BACKGROUND OF THE INVENTION

There are many known methods of measuring magnetic fields, including magnetometers based on moving and stationary coils, Hall effect, thin films, fluxgates, magnetic resonances, and superconducting devices. (For a review, see D. I. Gordon, R. E. Brown, and J. F. Haben, IEEE Trans. on Magnetics, Vol. May-8, 48(1972).) These have various limitations (e.g., high cost, necessity of cryogenic temperatures) and advantages (high sensitivity, etc.).

It is known to use light carrying optical fibers for detecting electromagnetic radiation. This principle has been used in the past in the practice application of detecting and measuring current in high voltage conductors. This method of detection usually involved passing a beam of polarized light through an optical fiber from one end to the other in the presence of a longitudinal magnetic field and measuring the extent or rotation (twist) of the polarized light plane. The extent of rotation is dependent upon the prevailing magnetic field. Such apparatus is disclosed in U.S. Pat. No. 3,936,742. Another example of this principle is discussed in U.S. Pat. No. 3,621,390 where the object is to measure a time-varied magnetic field where a light beam is split, passed through respective polarizers, which are circularly polarized in opposite direction, subjected to the Faraday effect and brought back into interference to produce an intensity-modulated light beam subject to detection. Such sensors, based on the Faraday effect, take advantage of the fact that right and left hand circular polarized light in a fiber undergo differential phase shifts when exposed to a magnetic field parallel to the direction of light propogation.

It has been proposed to use a magnetostrictive jacket around an optical fiber such that, when in the presence of a magnetic field, the jacket changes its dimensions so as to strain the fiber for causing an interferometry detectable phase shift in light passing through it when compared to light passing through a reference fiber.

The present invention proposes a much simpler arrangement in optical fibers for use in magnetometers for detecting geomagnetic anomalies or in antennas for detecting the magnetic field accompanying a time-varied electromagnetic radiation. It is known that metallic iron particles of spherical shape approximately 100 Å in diameter can be precipitated in fused quartz by melting under highly reducing conditions and subsequent annealing in vacuo (J. Appl. Phys. 50 2402, 1978). It is further known that by suitable heating and stretching of glasses containing spherical precipitates, these spherical particles can be made to elongate into aligned arrays of needle-like shapes. (J. Non-Cryst. Solids 15 437, 1974). It is further recognized that slightly elongate particles of metallic iron having dimensions of approximately 50 to 200 Å will have a single magnetic domain (J. Geophy. Res. 80, 252, 1975).

SUMMARY OF THE INVENTION

The invention relates to an optical fiber waveguide for use in detecting geomagnetic anomalies and magnetic fields in general including use in antennas for detecting time-varying magnetic fields accompanying electromagnetic radiation. An optical fiber waveguide is processed during drawing or manufacture to contain throughout in the core, cladding or jacketing an array of minute discrete elongate needle-like ferromagnetic particles all having a single magnetic domain and having their longitudinal axes and magnetization vectors aligned generally parallel to the longitudinal axis of the fiber. When a considerable length of optical fiber waveguide containing the magnetized particles is disposed transversely to a time-varying magnetic field, the magnetostrictive effect causes the particles to undergo longitudinal dimension changes generally corresponding to the time-varying magnetic field. Longitudinal elongation and contraction of the particles cause a related longitudinal dimension change in the optical fiber waveguide itself which can be measured by laser interferometry. An optical fiber waveguide according to the invention is adapted for use in a double path optical interferometer which detects light wave interference to indicate the presence of an outside disturbance on the fiber. A light beam from a common source is passed through a beam splitter with one beam passing through the optical fiber waveguide containing the elongate magnetized particles. This waveguide is subjected to the time varying magnetic field. The other beam is passed through a reference optical fiber, out of the presence of the magnetic field. The two beams are then reunited and passed to a photocell where interference between the two beams is detected, thus indicating the presence of a magnetic field.

OBJECTS OF THE INVENTION

It is an object of this invention to provide an optical fiber waveguide.

It is another object of this invention to provide an optical fiber waveguide for use with interferometry for detecting magnetic fields.

It is still another object of this invention to provide an optical fiber waveguide containing an array of minute discrete elongate single-domain magnetized particles embedded therein which in the presence of a time-varying magnetic field act on the waveguide in a manner for causing a detectable phase shift on a light beam passing therethrough.

It is yet another object of this invention to provide an optical waveguide adaptable for use in magnetometers.

It is a still further object of this invention to provide an optical fiber waveguide adaptable for use in antennas for detecting time-varying magnetic radiation such as that accompanying electromagnetic radiation.

Other objects of this invention will become apparent upon consideration of the specification and accompanying drawings:

BRIEF DESCRIPTION OF THE DRAWINGS

FIG. 1 is a representation of a short section of optical fiber waveguide including an array of discrete elongate magnetic particles according to the present invention.

FIG. 2 is a cross-sectional representation of the optical fiber waveguide illustrated in FIG. 1 illustrating magnetized particles in the jacketing.

FIG. 3 is a cross-sectional representation of an alternate optical fiber waveguide wherein the magnetized particles are in the optical core.

FIG. 4 is a schematic representation of an optical fiber waveguide according to the present invention formed into an antenna and associated with an interferometer to detect magnetic radiation.

DESCRIPTION OF THE PREFERRED EMBODIMENT

Referring now to the drawings, there is shown in FIG. 1 a short section of optical fiber waveguide 10 according to one form of the invention. This waveguide comprises a core 12 of high purity silica, surrounded by doped silica optical cladding 14, and fused quartz jacketing 16 outside the cladding, all secured together. As illustrated in FIG. 1, jacket 16 contains discrete elongate needle-like magnetized particles 18 disposed throughout. These particles are illustrated as contained in the outer jacket surrounding the cladding, but it will appreciated by those skilled in the art that the waveguide can be processed to contain them within the core or cladding, as well, or in any combination thereof. These particles, originally spherically shaped metallic precipitates in glass preforms, are elongated during the drawing process and in sufficiently small sizes are transparent.

FIG. 2 is a cross-sectional view of the waveguide shown in FIG. 1 and illustrates an optical fiber waveguide including a core, optical cladding and jacket wherein elongated needle-like magnetic particles are included in the outer jacket.

FIG. 3 is a cross-sectional view of an alternate form of the waveguide having a core and optical cladding with the magnetic particles included only in the core.

A unique aspect of this invention is the inclusion or incorporation of minute needle-like (elongate) single-domain ferromagnetic particles 18 in an optical fiber waveguide. The particles are single domain due to their small size and high aspect ratios. Particle sizes range in diameter from 100 to 300 Å and in length from 150 to 1000 Å for use in a core having a diameter from 1 μm to 100 μm or cladding or jacketing with wall thickness of 1 μm to 100 μm. The particles constitute about 0.0001 to 0.1% of the volume of the waveguide element in which embedded. During the fiber stretching or drawing process, in which the originally spherical shaped precipitates are caused to elongate, the particles generally align with each other with their major axes generally parallel with the axis of the optical core. Also during the drawing process, the particles are completely magnetized (parallel to the core axis) by the application of a weak axial magnetic field. It will be understood that upon solidification of the core, cladding or jacketing the elongate magnetized particles are firmly embedded within the dimensions of their glass matrix and their magnetization vectors 19 are unable to reverse the directionality imposed by the magnetic field applied while drawing.

When the solidified waveguide 10 is placed in the presence of a magnetic field, transverse to the axis of light propagation (also transverse to the elongate particles 18) the individual magnetization vectors 19 are caused to tilt slightly and the particles are thus caused to undergo a longitudinal length change (expansion) due to the magnetostrictive effect. Since the elongate particles are fixed to their matrix and their axes lie generally parallel with each other and with the axis of the waveguide, a longitudinal length change induced in the particles causes a corresponding or related change in the length of the waveguide itself which is measurable by laser interferometry. Thereby, the presence of a magnetic field can be detected. Such a waveguide is adapted to be configured to define an antenna for detecting magnetic radiation accompanying electromagnetic radiation. In an antenna, a time-varying magnetic field would cause related time-varying longitudinal dimension changes in the waveguide, also subject to detection by interferometry. Such an arrangement is illustrated in FIG. 4 and will be described later in the specification.

Regarding longitudinal length changes of the waveguide, if the fractional change in fiber length due to the magnetostrictive effect is denoted $(\Delta l/l)_{glass}$, then the differential system response to a change in external magnetic field is given by $$\frac{\partial}{\partial H}\left(\frac{\Delta l}{l}\right)_{glass} = 3\lambda_s \left(\frac{Y_{metal}}{Y_{glass}}\right) f \frac{H}{(2\pi M_s)^2},$$

where $\lambda_s$ is the isotropic saturation magnetostriction, $Y_{metal}$ and $Y_{glass}$ are the Young's moduli of the metal precipate and glass matrix, respectively, f is the volume fraction of the metal in the glass, $M_s$ is the saturation magnetization of the metal, and H is the ambient magnetic field transverse to the fiber or fiber coil. This response can be evaluated for metallic iron, using $f = 10^{-3}$
$Y_{iron}/Y_{glass} = 21/7 = 3$
$\lambda_s(iron) = -7 \times 10^{-6}$
$M_s(iron) = 1707$ Oersteds at 300° K.
H (ambient) = 1 Oe (geomagnetic field), with the result $$\frac{\partial}{\partial H}\left(\frac{\Delta l}{l}\right)_{glass} \approx 5 \times 10^{-6} \text{Å/Oe/meter of fiber length}.$$

An improvement in sensitivity by a factor of ~60 may be achieved by substituting nickel for iron as the precipitate. An additional improvement in sensitivity can be accomplished by applying a fixed biasing field such that H is caused to be larger than the geomagnetic field.

Since length changes ~$10^{-3}$ Å are measurable by interferometric methods and fiber lengths of the order of kilometers are routinely achievable using present technology, the device described here could be successfully employed as a low cost, high sensitivity geomagnetic anomaly detector.

The minute magnetized elongate particles may comprise from 0.0001 to 0.1% of the core, cladding or jacketing matrix in which contained. The waveguide length may range up to 1 km or more and may be fashioned, for example, in the form of a coil.

In reference to FIG. 4, there is shown an antenna and arrangement in which an optical fiber waveguide according to the present invention is adaptable for use. This antenna may comprise a coil or grid of the improved waveguides. The system includes a laser whose beam is split—one beam taking a path through the improved waveguide to an antenna and back to a photodetector and discriminator and the other beam passing through a reference fiber and modulator back to the same photodetector and discriminator for comparison. A considerable length of optical fiber waveguide 10 is formed into an antenna for most effectively intercepting magnetic radiation, and is caused to undergo longitudinal length changes due to sections being transversely disposed to the magnetic radiation for reasons previously described.

There has been disclosed an improved optical fiber waveguide adaptable having uses as disclosed. Obviously many modifications and variations are possible therein without departing from the spirit of the invention which is limited only by the scope of the claims annexed hereto.

What is claimed and desired to be secured by Letters Patent of the United States is:

1. An optical fiber waveguide for use in the detection of a magnetic field or magnetic radiation accompanying an electromagnetic signal comprising:
    an optical fiber waveguide including numerous discrete elongate single-domain magnetized particles;
    said particles having their longitudinal axes and magnetization vectors disposed generally parallel with the longitudinal axis of the waveguide;
    a laser with its beam directed into one end of said waveguide;
    interferometric means for sensing phase shifts in the light of said laser passing through said waveguide; and
    means for subjecting said waveguide to a tranverse magnetic field;
    whereby, said transverse magnetic field causes the elongate particles to undergo linear dimension change due to the magnetostrictive effect and to cause linear dimension changes in the optical fiber waveguide so that a laser beam light passing therethrough undergoes phase shifts detectable with interferometry.

2. The invention according to claim 1 wherein the waveguide includes an optical core and optical cladding.

3. The invention according to claim 2 wherein the particles are included in the optical core.

4. The invention according to claim 2 wherein the particles are included in the optical cladding.

5. The invention according to claim 2 wherein the particles are included in both the optical core and optical cladding.

6. The invention according to claim 2 further including jacketing secured around the optical cladding with the particles included in the jacketing.

7. An optical fiber waveguide for use in detecting time-varying magnetic radiation comprising:
    an optical fiber waveguide of considerable length;
    said optical fiber waveguide including an array of discrete minute high-aspect ratio magnetized particles all magnetized in the same direction with their axes generally parallel with the axis of waveguide;
    a laser with it beam directed into one end of said waveguide;
    interferometric means for sensing phase shifts in the light of said laser passing through said waveguide; and
    means for subjecting said waveguide to a transverse time-varying magnetic field;
    whereby said transverse time-varying magnetic radiation causes said particles to undergo linear dimension changes and to cause related linear dimension changes in the optical fiber waveguide for causing a phase shift of laser light passing therethrough detectable by interferometry.

8. The invention according to claim 7 wherein the waveguide includes an optical core surrounded by optical cladding.

9. The invention according to claim 8 wherein the particles are included in the core.

10. The invention according to claim 8 wherein the particles are included in the optical cladding.

11. The invention according to claim 8 further including jacketing surrounding the optical cladding and which jacketing includes the particles.

12. The invention according to claim 7, 8, 9, 10 or 11 wherein the particles are nickel.

13. The invention according to claim 7 wherein the particles comprise up to about 0.1% by volume of the matrix in which they are included.

14. The invention according to claim 12 wherein the particles comprise up to about 0.1% by volume of the matrix in which they are included.

15. The invention according to claim 13 wherein the particles have a length along the longitudinal axis of the waveguide of between 150 and 1000 Å and a diameter of between 100 and 300 Å.

16. The invention according to claim 14 wherein the particles have a length along the longitudinal axis of the waveguide of between 150 and 1000 Å and a diameter of between 100 and 300 Å.

17. A method for detecting a transverse magnetic field comprising:
    directing a beam of laser light into an optical fiber waveguide that includes numerous discrete single-domain magnetized particles, said particles having their longitudinal axes and magnetization vectors disposed generally parallel with the longitudinal axis of said waveguide;
    subjecting said waveguide to a transverse magnetic field; and
    detecting by interferometry phase shifts in said light passing through said waveguide caused by magnetostrictive linear dimension changes in said waveguide.

* * * * *